United States Patent
Aida et al.

(10) Patent No.: US 9,130,169 B2
(45) Date of Patent: Sep. 8, 2015

(54) PIEZOELECTRIC ELEMENT, PIEZOELECTRIC ACTUATOR, PIEZOELECTRIC SENSOR, HARD DISK DRIVE, AND INKJET PRINTER DEVICE

(71) Applicant: TDK CORPORATION, Tokyo (JP)

(72) Inventors: Yasuhiro Aida, Tokyo (JP); Yoshitomo Tanaka, Tokyo (JP); Hitoshi Sakuma, Tokyo (JP); Katsuyuki Kurachi, Tokyo (JP); Kazuhiko Maejima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 228 days.

(21) Appl. No.: 13/827,126

(22) Filed: Mar. 14, 2013

(65) Prior Publication Data

US 2014/0265723 A1    Sep. 18, 2014

(51) Int. Cl.
| | |
|---|---|
| *H01L 41/187* | (2006.01) |
| *B41J 2/045* | (2006.01) |
| *G01L 1/16* | (2006.01) |
| *H01L 41/08* | (2006.01) |
| *G01L 9/00* | (2006.01) |
| *H01L 41/09* | (2006.01) |

(52) U.S. Cl.
CPC ............ *H01L 41/1873* (2013.01); *B41J 2/045* (2013.01); *G01L 1/16* (2013.01); *G01L 9/008* (2013.01); *H01L 41/0805* (2013.01); *H01L 41/0973* (2013.01)

(58) Field of Classification Search
CPC .................... H01L 41/187; H01L 41/1873
USPC .......................................................... 310/358
See application file for complete search history.

(56) References Cited

U.S. PATENT DOCUMENTS

| | | | |
|---|---|---|---|
| 7,048,360 B2 | 5/2006 | Kanno et al. | |
| 8,288,020 B2 | 10/2012 | Harigai et al. | |
| 2006/0066180 A1* | 3/2006 | Nanataki et al. | 310/358 |
| 2008/0061263 A1* | 3/2008 | Kawada et al. | 310/358 |
| 2009/0302715 A1* | 12/2009 | Shibata et al. | 310/358 |
| 2011/0012051 A1* | 1/2011 | Kaigawa et al. | 252/62.9 R |

FOREIGN PATENT DOCUMENTS

| | | |
|---|---|---|
| JP | A-2008-192868 | 8/2008 |
| JP | A-2009-130182 | 6/2009 |

(Continued)

OTHER PUBLICATIONS

Wang et al., "Enhanced ferroelectric properties in MN-doped K0.5Na0.5NbO3 thin films derived from chemical solution deposition", Applied Physics Letters 97, 072902 (2010), pp. 072902-1-072902-3.

(Continued)

*Primary Examiner* — Derek Rosenau
(74) *Attorney, Agent, or Firm* — Oliff PLC

(57) ABSTRACT

A piezoelectric element includes, as a piezoelectric layer, a thin film of potassium sodium niobate that is a perovskite compound represented by a general expression $ABO_3$, in which Sr (strontium) is substituted on both of an A site and a B site and Mn (manganese) is substituted only on the A site. Accordingly, the piezoelectric element is provided to decrease a leak current of the piezoelectric element using the thin film of potassium sodium niobate, to increase a withstand voltage thereof and to improve piezoelectric characteristics thereof.

7 Claims, 9 Drawing Sheets

(56) References Cited

FOREIGN PATENT DOCUMENTS

JP          B-4588807          9/2010
WO       WO 03-070641 A1    8/2003

OTHER PUBLICATIONS

Lee et al., "Effect of Mn substitution on ferroelectric and leakage current characteristics of lead-free $(K_{0.5}Na_{0.5})(Mn_xNb_{1-x})O_3$ thin films", Current Applied Physics 11 (2011) S266-S269, journal homepage: www.elsevier.com/locate/cap.

Abazari et al., Effect of manganese doping on remnant polarization and leakage current in (K0.44, Na0.52,Li0.04)(Nb0.84,Ta0.10, Sb0.06)O3 epitaxial thin films on SrTiO3, Applied Physics Letters 92, 212903-1-212903-3.

* cited by examiner

PIEZOELECTRIC ELEMENT, PIEZOELECTRIC ACTUATOR, PIEZOELECTRIC SENSOR, HARD DISK DRIVE, AND INKJET PRINTER DEVICE

TECHNICAL FIELD

The present invention relates to a piezoelectric element using a thin film piezoelectric material, a piezoelectric actuator and a piezoelectric sensor using the piezoelectric element, and a hard disk drive and an ink jet printer apparatus including the piezoelectric actuator.

BACKGROUND ART

In recent years, the demand for lead-free piezoelectric materials has been increasing, and thus, the research for potassium sodium niobate ((K,Na)NbO$_3$ (hereinafter, also referred to as KNN)) has been gaining focus. The KNN has attracted attention because it has a relatively high Curie temperature and favorable piezoelectric characteristics in the lead-free piezoelectric materials.

Furthermore, the practical application of a piezoelectric element using a thin film piezoelectric material instead of a bulk piezoelectric material is increasing. An example of such piezoelectric element using a thin film piezoelectric material is a gyro sensor, a pressure sensor, a pulse wave sensor, a shock sensor as a piezoelectric sensor, or a microphone using a piezoelectric effect which converts a force applied to a piezoelectric layer to a voltage; or a hard disk drive head slider or an ink jet print head as a piezoelectric actuator using reverse piezoelectric effect in which the piezoelectric layer is deformed when a voltage is applied to the piezoelectric layer; or a speaker, a buzzer or a resonator using the same reverse piezoelectric effect.

When the piezoelectric material is thinned, since the element can be miniaturized, applicable fields are widened and a large number of elements can also be manufactured in a mass on a substrate, mass productivity is increased. In addition, when used in sensors, many benefits such as an improvement in performance of sensitivity are provided.

[PTL 1] Japanese Patent No. 4588807
[PTL 2] Japanese Unexamined Patent Application Publication No. 2009-130182
[PTL 3] Japanese Unexamined Patent Application Publication No. 2008-192868
[PTL 4] International Publication WO 2003/070641
[NPL 1] Lee et al: Current Applied Physics 11 (2011) 5266
[NPL 2] Wang et al: Applied Physics Letters 97, 072902 (2010)
[NPL 3] Abazari et al: Appl. Phys. Lett. 92, 212903 (2008)

SUMMARY OF INVENTION

However, there are problems that a leak current occurring in the KNN thin film is increased when a voltage is applied to both electrodes between which the KNN thin film is interposed and it is difficult to obtain actual function as the piezoelectric element. This is because when the leak current is increased, the element is prone to be heated and the reliability of the element becomes lower when a high voltage is applied to both the electrodes.

In addition, there are also problems that if the leak current is increased, a voltage is not effectively applied to a piezoelectric layer and the piezoelectric characteristics of the element are decreased. Furthermore, there are also concerns that since the leak current is increased, a withstand voltage is decreased and the element is prone to be destroyed when applying a high voltage.

As a method to reduce the leak current of the piezoelectric element, a technique is disclosed in which leak current characteristics are improved by stacking different materials (see PTL 1). However, in the technique, different materials having different lattice constants are necessary to be stacked and therefore crystallinity of the piezoelectric layer may be degraded and then the piezoelectric characteristics may be degraded. In addition, since the different materials are used, interdiffusion of the different materials is prone to occur due to heat, and the piezoelectric characteristics and the reliability of the element are prone to be degraded.

A technique is disclosed in which the leak current characteristics are improved by inserting a high-resistance current block layer having a predetermined resistance value or more between the electrodes (see PTL 2). However, with such a configuration, since a layer having a high resistance is inserted between the electrodes, it is difficult to apply the voltage to the piezoelectric layer and the piezoelectric characteristics of the element may be degraded.

In a technique disclosed in PTL 3, in a perovskite type oxide containing the KNN and represented by a general expression ABO$_3$, at least one component selected from a group consisting of Pb, Ba, La, Sr, Bi, Li, Na, Ca, Cd, Mg and K is used as a component in A site and at least one component selected from a group consisting of Ti, Zr, V, Nb, Ta, Cr, Mo, W, Mn, Sc, Co, Cu, In, Sn, Ga, Zn, Cd, Fe, Ni and lanthanide component is used as an component in B site. Accordingly, favorable electrical characteristics (leak characteristics and piezoelectric characteristics) are obtained. However, when the KNN thin film using K and Na as main ingredients in the A site, and Nb as a main ingredient in the B site is used as the piezoelectric element, sufficient electrical characteristics are not obtained even though the components except the three components described above are substituted on the sites.

In a technique disclosed in PTL 4, in a piezoelectric body having a perovskite type crystal structure represented by ABO$_3$, Pb is used as a main ingredient in the A site and Zr, Ti and Pb are used as main ingredients in the B site, and furthermore a percentage of Pb atom with respect to all atoms in the B site is 3% or more and 30% or less. Accordingly, it is assumed that favorable piezoelectric characteristics and leak current characteristics are obtained. However, since a deposition condition to dispose Pb of the main ingredient in both of the A and B sites is largely limited, there is lack of reproducibility and mass productivity. In addition, since Pb is harmful, there is a limit in operating environments and Pb is not preferable.

A technique is disclosed in which the leak current characteristics are improved by adding Mn (manganese) to the KNN thin film and thus attempting a reduction in a hole density and oxygen vacancy (see NPL 1, 2 and 3). However, there are problems that dielectric loss is increased and the piezoelectric characteristics are reduced when Mn is added.

The invention has been made in view of the above problems associated with the related art described above. An object of the invention is to provide a piezoelectric element in which a leak current of the piezoelectric element using a KNN thin film is reduced and a piezoelectric constant is more improved.

Since an obtainment of a large displacement is meant to have a high piezoelectric constant, an element using a piezoelectric effect can be used as a sensor having high sensitivity or the like, and an element using a reverse piezoelectric effect can be used as an effective actuator in which a large vibration is obtained with a small voltage.

In order to achieve the above object, a piezoelectric element according to the invention includes, as a piezoelectric layer, a thin film of potassium sodium niobate that is a perovskite compound represented by a general expression $ABO_3$. Sr (strontium) and Mn (manganese) are contained as additives, Sr is substituted on both of A site and B site, and Mn is substituted only on the A site in the piezoelectric layer.

The thin film of potassium sodium niobate (KNN) in which Sr (strontium) is substituted on both of the A site and the B site and Mn (manganese) is substituted only on the A site is provided as the piezoelectric layer. Accordingly, the leak current of the piezoelectric element can be reduced and the piezoelectric characteristics can be also improved.

In the piezoelectric layer, a large number of Sr can be stably held inside a crystal lattice and an amount of Sr entering a crystal grain boundary or the like can be reduced by disposing Sr in the B site as well as in the A site. Accordingly, it is possible to stably hold Sr inside the crystal lattice, and the piezoelectric characteristics are improved.

As for Mn, there is an effect that reduction in hole density and oxygen vacancy is promoted and then the leak current is reduced by disposing Mn only in the A site. This is because ion radiuses of K and Na which are the main ingredients in the A site and an ion radius of Nb which is the main ingredient in the B site are different from each other. The ion radius of $K^+$ is 0.164 nm and the ion radius of $Na^+$ is 0.139 nm. Meanwhile, the ion radius of $Nb^{5+}$ is 0.064 nm and the ion radius of $Mn^{2+}$ is 0.096 nm. When Mn is substituted on the B site, displacement efficiency is small and the effect of the reduction of the leak current is small since Mn is replaced with Nb having a small ion radius. Furthermore, excessive Mn is extracted at a grain boundary and causes the dielectric loss and degradation of the piezoelectric characteristics. The problems described above can be avoided by disposing Mn in the A site. In addition, Mn can be effectively added, and replacement of Mn with K and Nb which are the main ingredients can be carried out, and thus the leak current can be reduced without the dielectric loss and degradation of the piezoelectric characteristics. In addition, a disposal of Mn only in the A site means that distribution ratio of the A site is determined as 0.0% in an analysis result by using a current ALCHEMI method described below.

In the piezoelectric layer of the piezoelectric element according to the invention, a B site distribution ratio of Sr is preferably 5% or more and 50% or less. Accordingly, the piezoelectric characteristics can be more increased.

In the piezoelectric element according to the invention, at least one or more components selected from Li (lithium), Ba (barium), Ta (tantalum), Zr (Zirconium) is preferably contained in the piezoelectric layer. Accordingly, the piezoelectric characteristics of the piezoelectric element can be further increased.

A piezoelectric actuator according to the invention has the piezoelectric element represented by the configuration described above. Particularly, the piezoelectric actuator includes a head assembly of a hard disk drive, a piezoelectric actuator of an ink jet printer head or the like.

In addition, a piezoelectric sensor according to the invention has the piezoelectric element represented by the configuration described above. Particularly, the piezoelectric sensor includes a gyro sensor, a pressure sensor, a pulse wave sensor or the like.

Then, in a hard disk drive and an ink jet printer apparatus according to the invention, the piezoelectric actuator described above is used.

According to the piezoelectric element according to the invention, the leak current can be reduced and the piezoelectric characteristics can also be improved compared to the piezoelectric element using the KNN thin film of the related art. In addition, in the piezoelectric actuator and the piezoelectric sensor according to the invention, the leak current can be reduced and the piezoelectric characteristics can also be improved. Accordingly, the hard disk drive and the ink jet printer apparatus having a high performance can be provided.

DESCRIPTION OF EMBODIMENTS

Figure 1:
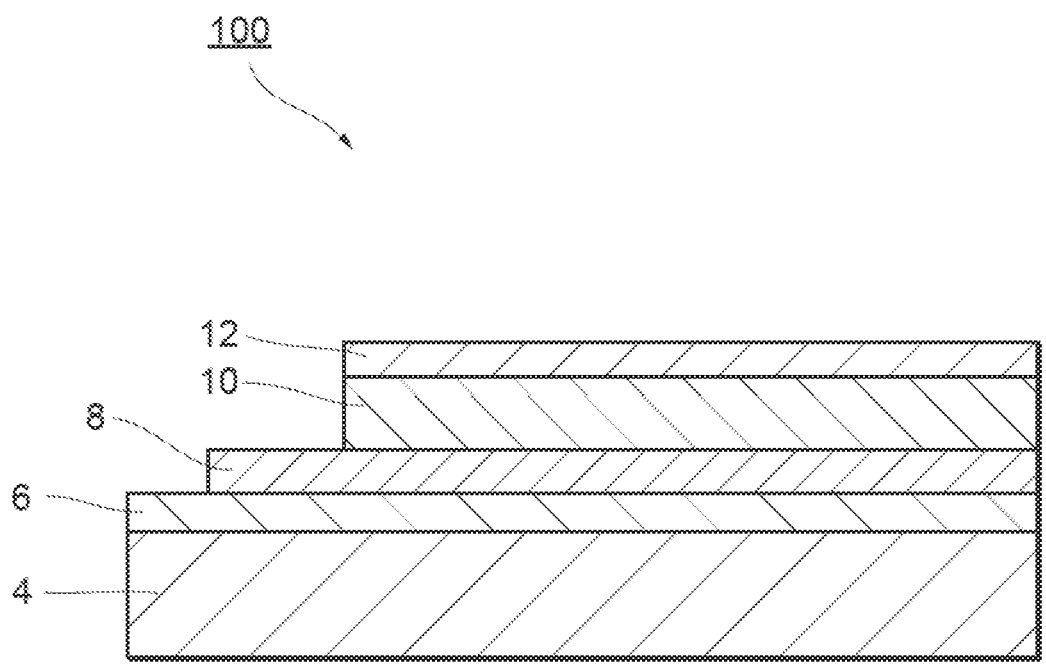
FIG. 1 is a configuration view of a piezoelectric element according to an embodiment of the invention.

Hereinafter, preferred embodiments of the invention will be described in detail with reference to the drawings. In addition, in the drawings, the same reference numeral is given to the same or an equivalent element. In addition, vertical and horizontal positional relationships are as illustrated in the drawings. In addition, descriptions are omitted when the descriptions are repeated.

(Piezoelectric Element)

FIG. 1 illustrates a piezoelectric element 100 according to the embodiment. The piezoelectric element 100 includes a substrate 4, an insulation layer 6 and a first electrode layer 8 provided on the substrate 4, a piezoelectric layer 10 formed on the first electrode layer 8 and a second electrode layer 12 formed on the piezoelectric layer 10.

As for the substrate 4, a silicon substrate having a (100) surface orientation can be used. The substrate 4 has, for example, a thickness of 50 μm or more and 1000 μm or less. In addition, as for the substrate 4, the silicon substrate having a surface orientation different from a (100) surface, a Silicon on Insulator (SOI) substrate, a quartz glass substrate, a compound semiconductor substrate made of GaAs or the like, a sapphire substrate, a metal substrate made of stainless steel or the like, a MgO substrate, a $SrTiO_3$ substrate or the like can be used.

The insulation layer 6 is used in a case where the substrate 4 is conductive. As for the insulation layer 6, thermal oxidation film ($SiO_2$) of the silicon, $Si_3N_4$, $ZrO_2$, $Y_2O_3$, ZnO, $Al_2O_3$ or the like can be used. If the substrate 4 does not have the conductivity, the insulation layer 6 may be omitted. The insulation layer 6 can be formed by using a sputtering method, a vacuum deposition method, a thermal oxidation method, a printing method, a spin coat method, a sol-gel method or the like.

The first electrode layer 8 is, for example, formed of Pt (platinum). The first electrode layer 8 has, for example, a thickness of 0.02 μm or more and 1.0 μm or less. A formation of the first electrode layer 8 of Pt enables the piezoelectric layer 10 to have a high orientation. In addition, as for the first electrode layer 8, a metal material such as Pd (palladium), Rh (rhodium), Au (gold), Ru (ruthenium), Ir (iridium), Mo (molybdenum), Ti (titanium), Ta (tantalum), or a conductive metal oxide such as $SrRuO_3$, $LaNiO_3$ can be used. The first electrode layer 8 can be formed by using the sputtering method, the vacuum deposition method, the printing method, the spin coat method, the sol-gel method or the like.

As for a material using for the piezoelectric layer 10, (Ka, Na)$NbO_3$ (potassium sodium niobate) that is a perovskite compound represented by a general expression $ABO_3$ is used in which Sr (strontium) and Mn (manganese) are contained as additives, Sr is substituted on both of A site and B site, and Mn is substituted only on the A site.

The piezoelectric layer 10 is formed by heat treatment while supplying nitrogen-oxygen gas mixtures after deposition by using the sputtering method, the vacuum deposition method, the printing method, the spin coat method, the sol-gel method or the like.

As for the heat treatment temperature, 600° C. or more and 700° C. or less is preferable. When performing a heat treatment at a temperature of 600° C. or more, Mn contained in the piezoelectric layer 10 can be substituted on the A site and a leak current of the piezoelectric element 100 can be reduced without dielectric loss and degrading piezoelectric characteristics. When perfoiining the heat treatment at a temperature of 700° C. or less, the piezoelectric layer 10 can be prevented from reacting with other layers in contact with the piezoelectric layer 10 and the piezoelectric characteristics of the piezoelectric element 100 can be prevented from being degraded.

As for a partial pressure of oxygen when the heat treatment is performed, 1.5% or more and 30% or less is preferable. Sr can be substituted on both of the A and B sites and the piezoelectric characteristics can be improved by setting the partial pressure of oxygen at 1.5% or more. Sr can be prevented from being excessively substituted on the B site and the degradation of the piezoelectric characteristics can be suppressed by setting the partial pressure of oxygen at 30% or less.

The leak current of the piezoelectric element 100 can be reduced and the piezoelectric characteristics can be improved by providing a thin film of potassium sodium niobate (KNN) in which Sr (strontium) is substituted on both of the A site and the B site and Mn (manganese) is substituted only on the A site.

As for content of Sr and content of Mn in the piezoelectric layer 10, 0.1 at % or more and 5.0 at % or less is preferable, respectively.

The piezoelectric characteristics of the piezoelectric element 100 can be more increased with the content of Sr of 0.1 at % or more and the degradation of the piezoelectric characteristics can be even more suppressed with the content of Sr of 5.0 at % or less.

The leak current characteristics of the piezoelectric element 100 can be more improved with the content of Mn of 0.1 at % or more and the increase in the dielectric loss and the degradation of the piezoelectric characteristics can be even more suppressed with the content of Mn of 5.0 at % or less.

In addition, as for the B site distribution ratio of Sr included in the piezoelectric layer 10, 5% or more and 50% or less is preferable.

The piezoelectric characteristics of the piezoelectric element 100 can be more increased with the B site distribution ratio of Sr of 5% or more and the degradation of the piezoelectric characteristics can be even more suppressed with the B site distribution ratio of Sr of 50% or less.

Furthermore, it is preferable that the piezoelectric layer 10 contain at least one or more components selected from Li (lithium), Ba (barium), Ta (tantalum) and Zr (Zirconium). As for the content of each of these components, 0.1 at % or more and 5.0 at % or less is more preferable. Accordingly, the piezoelectric characteristics of the piezoelectric element 100 can be more increased.

In addition, the content of each component including Sr and Mn is determined to be 100 at % in total in the thin film of KNN containing each component.

Furthermore, in the piezoelectric layer 10, it is preferable that a value which is calculated from the content of Sr and the B site distribution ratio of Sr which are represented in the following expression (1) be 5.0 or more and 50 or less. Accordingly, the piezoelectric characteristics of the piezoelectric element 100 can be further increased.

B site distribution ratio (%) of Sr/content (at %) of Sr  Expression (1)

A value obtained by the expression (1) is a numerical value indicating a correlation between the content of Sr and the B site distribution ratio of Sr. It indicates that appropriate B site distribution ratios are different from each other in cases where the Sr content is low and high.

The second electrode layer 12 is formed of Pt, for example. The second electrode layer 12 has, for example, a thickness of 0.02 pim or more and 1.0 μm or less. In addition, as for the second electrode layer 12, the metal material such as Pd, Rh, Au, Ru, 1r, Mo, Ti, Ta, or the conductive metal oxide such as $SrRuO_3$, $LaNiO_3$ can be used. The second electrode layer 12 can be formed by using the sputtering method, the vacuum deposition method, the printing method, the spin coat method, the sol-gel method or the like.

In addition, the substrate 4 may be removed from the piezoelectric element 100. Accordingly, a displacement amount or sensitivity of the piezoelectric element can be increased.

In addition, the piezoelectric element 100 may be coated with a protection film. Accordingly, the reliability can be increased.

The piezoelectric element 100 may include an intermediate layer between any one or both of the first electrode layer 8 and the second electrode layer 12, and the piezoelectric layer 10.

As for the intermediate layer, the conductive oxide is used. Particularly, $SrRuO_3$, $SrTiO_3$, $LaNiO_3$, $CaRuO_3$, $BaRuO_3$, $(La_xSr_{1-x})CoO_3$, $YBa_2Cu_3O_7$, $La_4BaCu_5O_{13}$ or the like having high conductivity and a good heat resistance is preferably used.

(Piezoelectric Actuator)

Figure 2A:
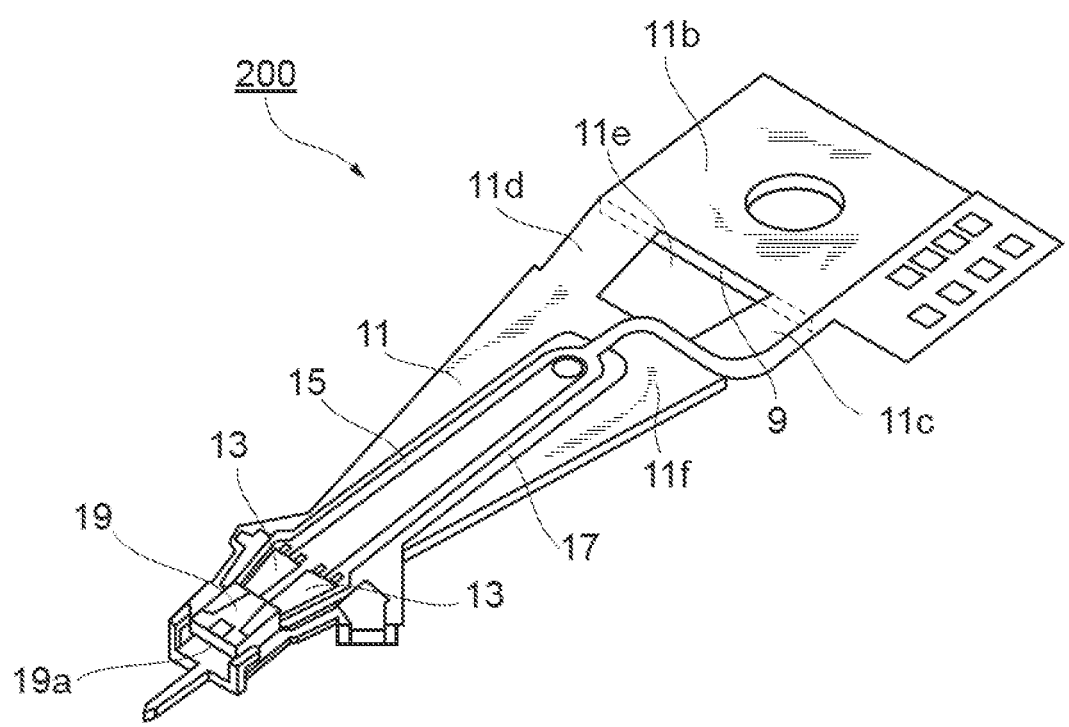
FIGS. 2A and 2B are structure views of a piezoelectric actuator according to the invention.

FIG. 2A is a configuration view of a head assembly mounted on a hard disk drive (hereinafter, also referred to as an HDD) as an example of the piezoelectric actuator using the piezoelectric element. As illustrated in the view, a head assembly 200 includes, as main components, a base plate 9, a load beam 11, a flexure 17, first and second piezoelectric elements 13 which are driving elements, and a slider 19 having a head element 19a.

Then, the load beam 11 includes a base end section 11b which is fixed to the base plate 9 by using, for example, beam welding or the like, first and second leaf spring sections 11c and 11d which are extended from the base end section 11b in a tapered shape, an opening section 11e which is formed between the first and second leaf spring sections 11c and 11d, and a beam main section 11f which is extended straightly and in a tapered shape from the first and second leaf spring sections 11c and 11d.

The first and second piezoelectric elements 13 are disposed having a predetermined clearance between them, on a wiring flexible substrate 15 that is a portion of the flexure 17. The slider 19 is fixed to a front end portion of the flexure 17 and is rotated corresponding to expansion and contraction of the first and second piezoelectric elements 13.

The first and second piezoelectric elements 13 are configured to have a first electrode layer, a second electrode layer and a piezoelectric layer which is interposed between the first and second electrode layer. In addition, since the piezoelectric layer having a small leak current and a large displacement amount is used as the piezoelectric layer which is used in the piezoelectric actuator of the invention, a high withstand voltage and a sufficient displacement amount can be obtained.

Figure 2B:
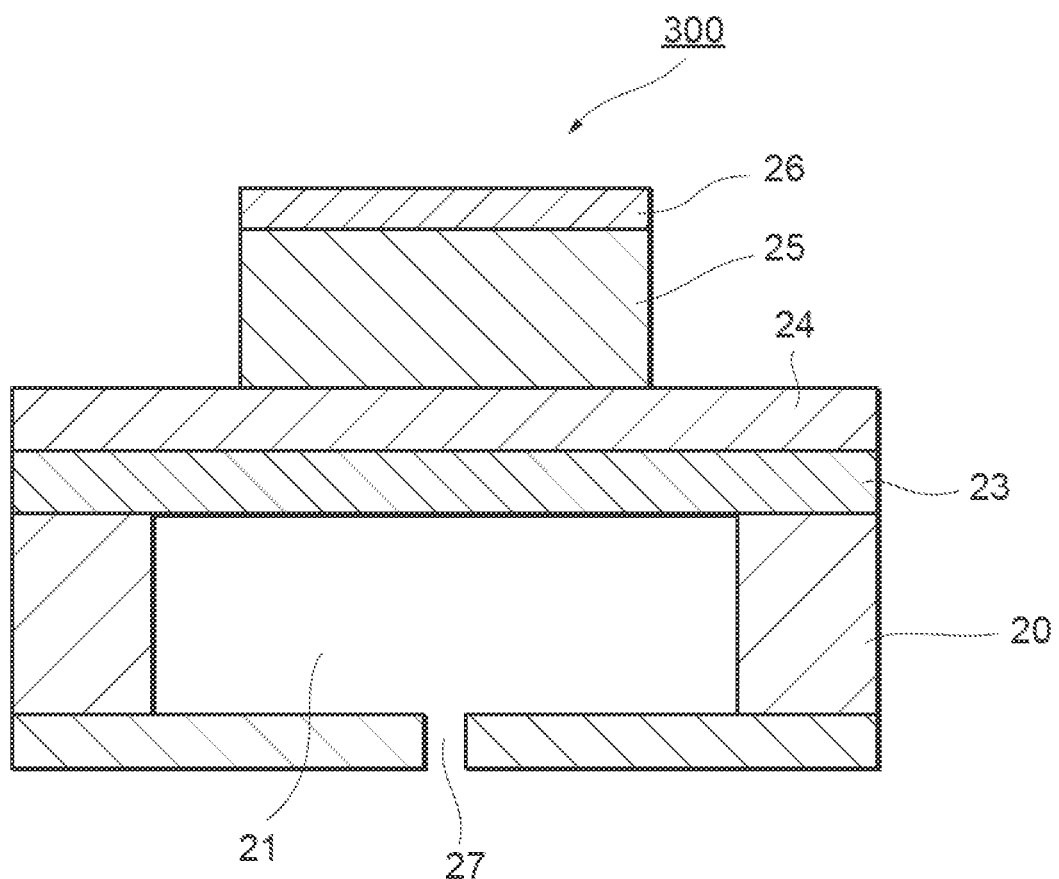

FIG. 2B is a configuration view of the piezoelectric actuator of the ink jet printer head as another example of the piezoelectric actuator using the piezoelectric element described above.

A piezoelectric actuator 300 is configured by stacking an insulation film 23, a lower electrode layer 24, a piezoelectric layer 25 and an upper electrode layer 26 on a substrate 20.

When a predetermined ejection signal is not supplied and a voltage is not applied between the lower electrode layer 24 and the upper electrode layer 26, deformation does not occur in the piezoelectric layer 25. A pressure change does not occur in a pressure chamber 21 in which the piezoelectric element, where the ejection signal is not supplied, is provided. In addition, ink droplets are not ejected from a nozzle 27 thereof.

Meanwhile, when a predetermined ejection signal is supplied and a constant voltage is applied between the lower electrode layer 24 and the upper electrode layer 26, deformation occurs in the piezoelectric layer 25. The insulation film 23 is largely bent in the pressure chamber 21 in which the piezoelectric element, where the ejection signal is supplied, is provided. Thus, a pressure inside the pressure chamber 21 is momentarily increased and then ink droplets are ejected from the nozzle 27.

Herein, since the piezoelectric layer having a small leak current and a high displacement amount is used as the piezoelectric layer of the piezoelectric actuator of the invention, a high withstand voltage and a sufficient displacement amount can be obtained.

(Piezoelectric Sensor)

Figure 3A:
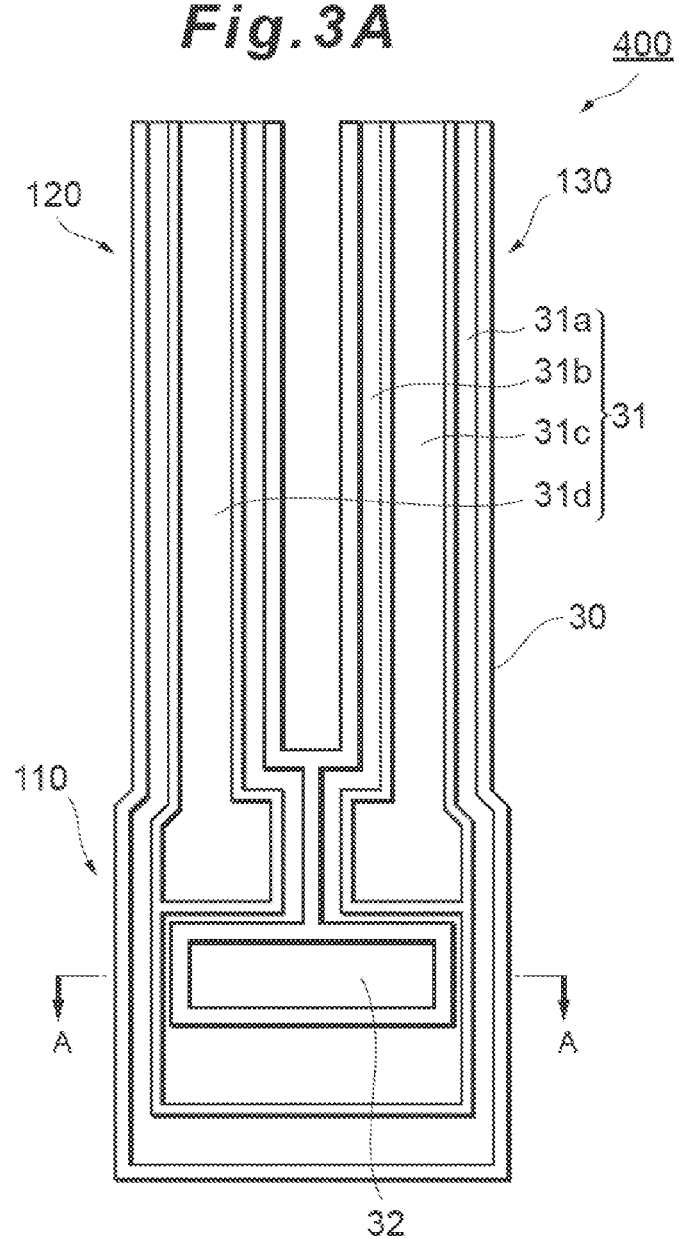
FIGS. 3A to 3D are structure views of piezoelectric sensors according to the invention.
Figure 3B:
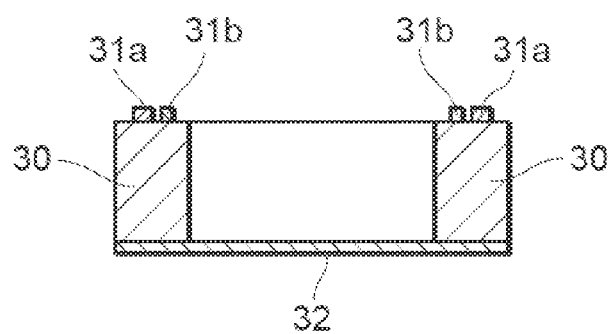

FIG. 3A is a configuration view (a plan view) of a gyro sensor as an example of the piezoelectric sensor using the piezoelectric element described above and FIG. 3B is a cross-sectional view which is taken along a line A-A in FIG. 3A.

A gyro sensor 400 is a tuning fork vibrator type angular velocity detecting element including a base section 110, two arms 120 and 130 connected to one surface of the base section 110. The gyro sensor 400 is obtained by micromachining a piezoelectric layer 30, an upper electrode layer 31 and a lower electrode layer 32 configuring the piezoelectric body element described above conforming to a shape of the tuning fork type vibrator. The respective portions (the base section 110 and the arms 120 and 130) are integrally formed by the piezoelectric element.

A first main surface of one arm 120 has driving electrode layers 31a and 31b, and a detection electrode layer 31d. Similarly, a first main surface of the other arm 130 has the driving electrode layers 31a and 31b, and a detection electrode layer 31c. Each of the electrode layers 31a, 31b, 31 c and 31d is obtained by etching the upper electrode layer 31 into a predetermined electrode shape.

In addition, the lower electrode layer 32 formed all over each of second main surfaces (a main surface on a rear side of the first main surface) of the base section 110 and the arms 120 and 130 functions as a ground electrode of the gyro sensor 400.

Herein, an XYZ orthogonal coordinate system is defined in which a longitudinal direction of each of the arms 120 and 130 is taken as a Z direction and a plane containing the main surfaces of the two arms 120 and 130 is taken as an XZ plane.

When a driving signal is supplied to the driving electrode layers 31a and 31b, the two arms 120 and 130 are excited in an in-plane vibration mode. The in-plane vibration mode refers to a vibration mode in which the two arms 120 and 130 are excited in a direction parallel to the main surfaces of the two arms 120 and 130. For example, when one arm 120 is excited at a velocity V1 in a −X direction, the other arm 130 is excited at a velocity V2 in a +X direction.

In this state, when a rotation of angular velocity a) is applied to the gyro sensor 400 about a Z axis as a rotational axis, Coriolis forces are acted on each of the two arms 120 and 130 in directions orthogonal to velocity directions and the two arms 120 and 130 begin to be excited in an out-of-plane vibration mode. The out-of-plane vibration mode refers to a vibration mode in which the two arms 120 and 130 are excited in a direction orthogonal to the main surfaces of the two arms 120 and 130. For example, when Coriolis force F1 acted on one arm 120 is in a −Y direction, Coriolis force F2 acted on the other arm 130 is in a +Y direction.

Since magnitudes of the Coriolis forces F1 and F2 are proportional to the angular velocity ω, mechanical distortions of the arms 120 and 130 by the Coriolis forces F1 and F2 are converted into electrical signals (detection signals) by using the piezoelectric layer 30 and the electrical signals are taken out from the detection electrode layers 31c and 31d and then the angular velocity co can be obtained.

Since the piezoelectric layer having a small leak current and a large displacement amount is used as the piezoelectric layer in the piezoelectric sensor of the invention, a high withstand voltage and a sufficient detection sensitivity can be obtained.

Figure 3C:
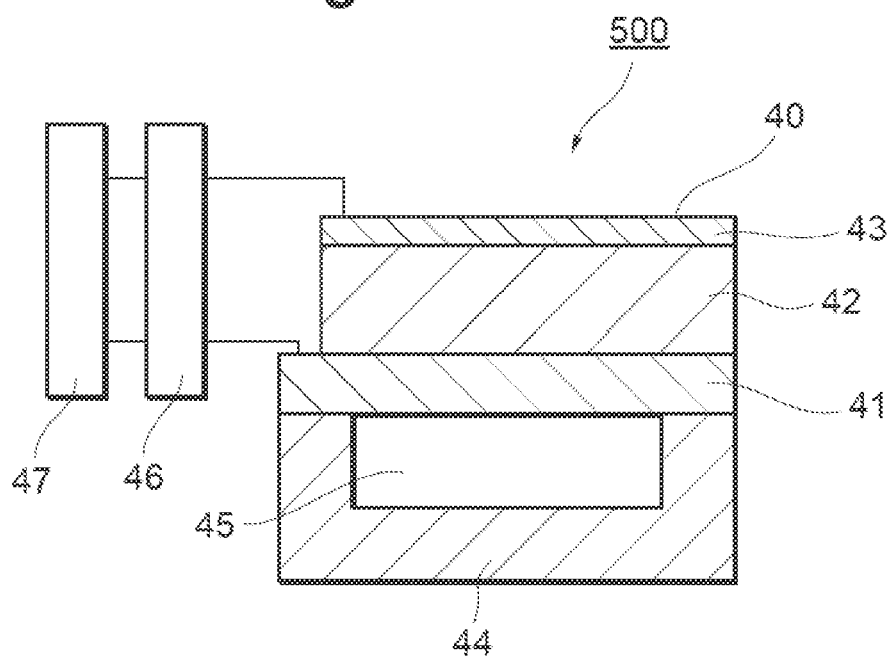

FIG. 3C is a configuration view of a pressure sensor as a second example of the piezoelectric sensor using the piezoelectric element described above.

A pressure sensor 500 has a cavity 45 to correspond to a case where a pressure is received and is configured to have a support body 44 supporting a piezoelectric element 40, a current amplifier 46 and a voltage measuring device 47. The piezoelectric element 40 is formed with a common electrode layer 41, a piezoelectric layer 42 and an individual electrode layer 43 which are stacked on the support body 44 in this order. Herein, when an external force is applied, the piezoelectric element 40 is bent and a voltage is detected in the voltage measuring device 47.

Since the piezoelectric layer having a small leak current and a large displacement amount is used as the piezoelectric layer in the piezoelectric sensor of the invention, a high withstand voltage and a sufficient detection sensitivity can be obtained.

Figure 3D:
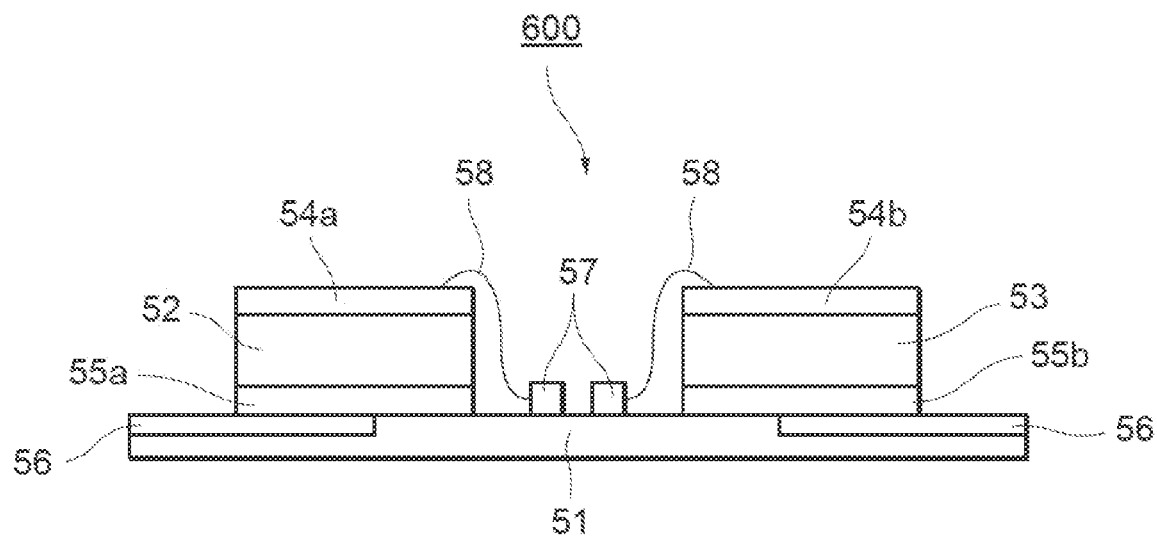

FIG. 3D is a configuration view of a pulse wave sensor as a third example of the piezoelectric sensor using the piezoelectric element described above.

A pulse wave sensor 600 has a configuration in which a transmission piezoelectric element and a receiving piezoelectric element are mounted on a substrate 51. Herein, in the transmission piezoelectric element, electrode layers 54a and 55a are formed on both surfaces of a transmission piezoelectric layer 52 in a thickness direction thereof and in the receiving piezoelectric element, electrode layers 54b and 55b are formed on both surfaces of a receiving piezoelectric layer 53 in a thickness direction thereof. In addition, electrodes 56 and an upper surface electrode 57 are formed on the substrate 51.

In addition, each of the electrode layers 54a and 54b, and the upper surface electrode 57 are electrically connected to each other via wiring 58.

In order to detect pulses of a living body, first, a rear surface (a surface on which the piezoelectric element is not mounted) of the substrate of the pulse wave sensor 600 comes into contact with the living body. Then, when the pulse is detected, a specific driving voltage signal is output to both electrode layers 54a and 55a of the transmission piezoelectric element. The transmission piezoelectric element is excited and generates ultrasonic wave in response to the driving voltage signal which is input into the both electrode layers 54a and 55a, and transmits the ultrasonic waves inside the living body. The ultrasonic wave transmitted into the living body is reflected by blood flow and received by the receiving piezoelectric element. The receiving piezoelectric element converts the received ultrasonic wave into a voltage signal and outputs the voltage signal from the both electrode layers 54b and 55b.

Since the piezoelectric layer having a small leak current is used as the piezoelectric layers in the piezoelectric sensors of the invention, a high withstand voltage and a sufficient detection sensitivity can be obtained.

(Hard Disk Drive)

Figure 4:
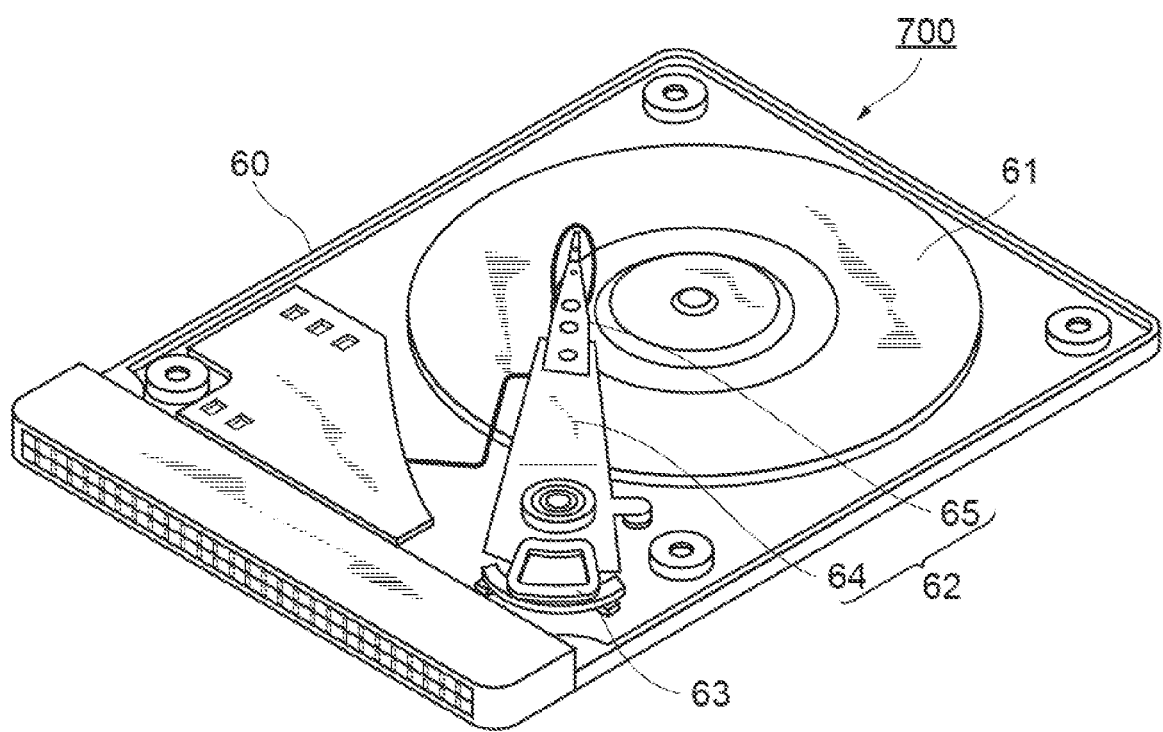
FIG. 4 is a structure view of a hard disk drive according to the invention.

FIG. 4 is a configuration view of a hard disk drive on which the head assembly illustrated in FIG. 2A is mounted.

A hard disk drive 700 includes a hard disk 61 as a recording medium and a head stack assembly 62 which records and reproduces magnetic information on the hard disk 61 inside a housing 60. The hard disk 61 is rotated by a motor (not illustrated).

The head stack assembly 62 is configured so that a plurality of assemblies, which are configured by an actuator arm 64 rotatably supported around a support shaft by a voice coil motor 63 and a head assembly 65 connected to the actuator arm 64, are stacked in a depth direction of the view. A head slider 19 is attached to a front end portion of the head assembly 65 so as to face the hard disk 61 (see FIG. 2A).

The head assembly 65 employs a form in which the head element 19a (see FIG. 2A) is moved in two steps. A relatively large movement of the head element 19a is controlled by entirely driving the head assembly 65 and the actuator arm 64 by using the voice coil motor 63, and a fine movement thereof is controlled by driving the head slider 19 by the front end portion of the head assembly 65.

In a piezoelectric element used in the head assembly 65, since a piezoelectric layer having a small leak current and a large displacement amount is used as the piezoelectric layer, a high withstand voltage and a sufficient accessibility can be obtained.

(Ink Jet Printer Apparatus)

Figure 5:
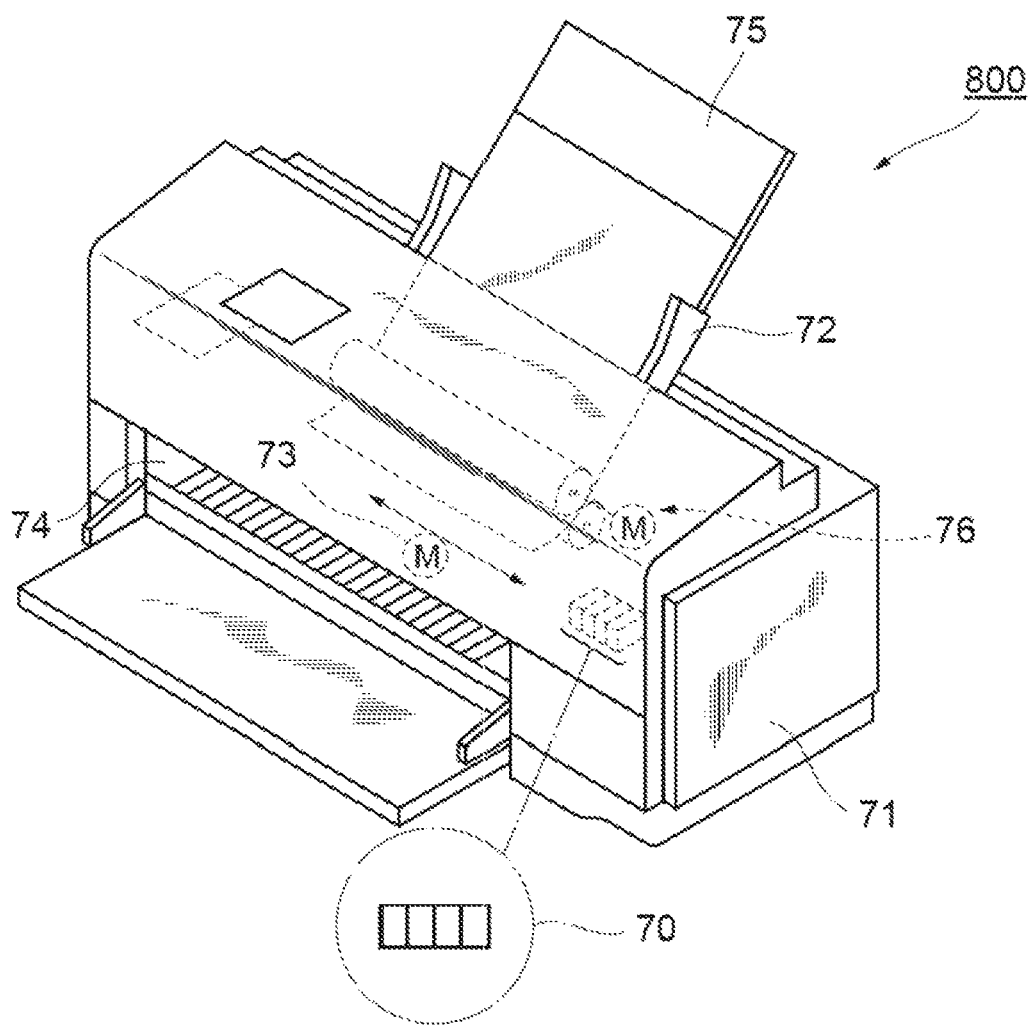
FIG. 5 is a structure view of an ink jet printer apparatus according to the invention.

FIG. 5 is a configuration view of an ink jet printer apparatus on which an ink jet printer head illustrated in FIG. 2B is mounted.

An ink jet printer apparatus 800 is configured to mainly include an ink jet printer head 70, a body 71, a tray 72 and a head driving mechanism 73.

The ink jet printer apparatus 800 includes ink cartridges of total four colors of yellow, magenta, cyan and black, and is configured to allow full-color print. In addition, the ink jet printer apparatus 800 includes a dedicated controller board or the like in the inside thereof and controls ink ejection timing of the ink jet printer head 70 and scanning of the head driving mechanism 73. In addition, the body 71 includes the tray 72 in a rear surface thereof and an auto sheet feeder (an automatic continuous paper feeding mechanism) 76 in the inside thereof as well. The body 71 automatically delivers a recording paper 75 and discharges the recording paper 75 from an outlet 74 in a front face thereof.

In the piezoelectric element used in the piezoelectric actuator of the ink jet printer head 70, since the piezoelectric layer having a small leak current and a large displacement amount is used as the piezoelectric layer, the ink jet printer apparatus having a high withstand voltage and a high safety can be provided.

For example, the piezoelectric element of the invention can be used for devices utilizing piezoelectric effect such as a gyro sensor, a shock sensor, a microphone and the like, or can be used for devices utilizing reverse piezoelectric effect such as an actuator, an ink jet head, a speaker, a buzzer, a resonator and the like. The piezoelectric element of the invention is particularly suitable for the piezoelectric element using the reverse piezoelectric effect.

EXAMPLES

Hereinafter, the invention is described more specifically, based on examples and comparative examples. However, the invention is not limited to the examples described below.

(Manufacturing of Piezoelectric Element)

Example 1

In the example, "base body" refers to a body to be deposited in each step.

A silicon wafer (the substrate 4) having a diameter of 3 inches on which a thermal oxide film ($SiO_2$: the insulation layer 6) is attached was disposed inside a vacuum chamber of a RF sputtering device and then vacuum evacuation was carried out and then Pt was deposited as the first electrode layer 8 thereon. A temperature of the base body was 400° C. during the deposition and a thickness of the first electrode layer 8 was 200 nm.

Continuously, the base body was transferred into the chamber of the RF sputtering device where a sputtering target was mounted and then vacuum evacuation was carried out and then a thin film of $(K_{0.5}Na_{0.5})NbO_3$ containing Sr of 1.0 at % and Mn of 1.0 at % was deposited as the piezoelectric layer 10. As the sputtering target, a sintered body of $(K_{0.5}Na_{0.5})NbO_3$ containing Sr of 1.0 at % and Mn of 1.0 at % was used. A temperature of the base body was 550° C. and a thickness of the piezoelectric layer 10 was 2000 inn during the deposition.

After the piezoelectric layer 10 was deposited, the base body was transferred to a heat treatment apparatus and then a heat treatment was carried out. The heat treatment was carried out for one hour while setting a temperature of the heat treatment at 600° C. and supplying nitrogen-oxygen gas mixtures. In addition, a partial pressure of oxygen was set at 1.5%.

After the piezoelectric layer 10 was deposited, in order to calculate sites where Sr and Mn which were additives were substituted on a crystal structure and A site and B site distribution ratios thereof, and analysis was carried out by using Atom-Location by Channeling Enhanced Microanalysis method (referred to as ALCHEMI method, hereinafter).

The ALCHEMI method is a method which determines positions of impurity atoms in the crystal by using a phenomenon (electron channeling) in which incident electrons pass through specific atomic positions. Difference in intensity was observed which was obtained using Energy Dispersive Spectroscopy (referred to as TEDS, hereinafter) or Energy Loss Spectroscopy (referred to as EELS, hereinafter) by inclining sequentially an electronic beam to a plus side and a minus side of Bragg condition while observing an electron diffraction pattern with a transmission electron microscope. Accordingly, occupied positions (sites) of the impurity atoms could be distinguished. In the example, the EDS was used.

The piezoelectric layer 10 is a perovskite compound, represented by a general expression $ABO_3$, of which a main ingredient is potassium sodium niobate. Then, in a calculation of site distribution ratios of Sr and Mn, it was assumed that K (potassium) and Na (sodium) were substituted 100% on the A site and Nb (niobium) was substituted 100% on the B site as main ingredients.

In the piezoelectric layer 10, an A site distribution ratio of Sr was 97.0% and a B site distribution ratio of Sr was 3.0%, which were calculated by using the ALCHEMI analysis. In addition, an A site distribution ratio of Mn was 100.0% and a B site distribution ratio of Mn is 0.0%. In a heat treatment less than a temperature of 600° C., the A site distribution ratio of Mn was more reduced. In addition, in a heat treatment in which a partial pressure of oxygen is less than 1.5%, the B site distribution ratio of Sr is more reduced.

After that, the base body was transferred again to another chamber of the RF sputtering device and then vacuum excavation was carried out, and then Pt was deposited as the second electrode layer 12. A temperature of the base body was 200° C. and a thickness of the second electrode layer 12 was 200 nm during the deposition.

After the second electrode layer 12 was formed, a stacked body containing the piezoelectric layer 10 was patterned by using photolithography, dry etching and wet etching and then the wafer was cut, and the piezoelectric element 100 of which a movable part had a dimension of 5 mm×20 mm was obtained.

Main ingredients, additives of the piezoelectric layer 10 and each content thereof, the temperature of the heat treatment and the partial pressure of oxygen during the heat treatment according to the example are illustrated in Table 1. Furthermore, the A and B site distribution ratios of Sr and Mn calculated by the ALCHEMI analysis and the value of the B site distribution ratio of Sr/content of Sr, are illustrated.

Comparative Example 1

In a manufacturing step of the piezoelectric element 100 of Example 1, after the first electrode layer was formed, the base body was transferred to the other chamber of the RF sputtering device and then vacuum excavation was carried out, and then the thin film of $(K_{0.5}Na_{0.5})NbO_3$ was deposited as the piezoelectric layer. The sintered body of $(K_{0.5}Na_{0.5})NbO_3$ containing no additives was used as a sputtering target. A temperature of the base body was 550° C. and a thickness of the piezoelectric layer was 2000 nm during the deposition.

A heat treatment was not carried out after the piezoelectric layer was deposited.

The piezoelectric element of Comparative Example 1 was manufactured using the same element configuration and manufacturing step as Example 1 except the piezoelectric layer.

Main ingredients of the piezoelectric layer according to Comparative Example 1 are illustrated in Table 1.

Comparative Example 2

The thin film of $(K_{0.5}Na_{0.5})NbO_3$ containing Sr of 1.0 at % and Mn of 1.0 at % was deposited as the piezoelectric layer. The sintered body of $(K_{0.5}Na_{0.5})NbO_3$ containing Sr of 1.0 at % and Mn of 1.0 at % was used as the sputtering target. The temperature of the base body was 550° C. and a thickness of the piezoelectric layer was 2000 nm during the deposition.

The heat treatment was not carried out which was carried out in Example 1 after the piezoelectric layer was deposited.

The piezoelectric element of Comparative Example 2 was manufactured using the same element configuration and manufacturing step as Example 1 except the piezoelectric layer.

Main ingredients, additives of the piezoelectric layer and each content thereof according to Comparative Example 2 are illustrated in Table 1. Furthermore, the A site and the B site distribution ratios of Sr and Mn calculated by the ALCHEMI analysis and the value of the B site distribution ratio of Sr/content of Sr are illustrated.

Comparative Example 3

The thin film of $(K_{0.5}Na_{0.5})NbO_3$ containing Sr of 1.0 at % and Mn of 1.0 at % was deposited as the piezoelectric layer. The sintered body of $(K_{0.5}Na_{0.5})NbO_3$ containing Sr of 1.0 at % and Mn of 1.0 at % was used as a sputtering target. A temperature of the base body was 550° C. and a thickness of the piezoelectric layer was 2000 nm during the deposition.

After the piezoelectric layer was deposited, the base body was transferred to the heat treatment apparatus and then a heat treatment was carried out. The heat treatment was carried out for one hour while setting a temperature of the heat treatment at 500° C. and supplying nitrogen-oxygen gas mixtures. In addition, a partial pressure of oxygen was set at 1.0%.

The piezoelectric element of Comparative Example 3 was manufactured using the same element configuration and manufacturing step as Example 1 except the piezoelectric layer.

Main ingredients, additives of the piezoelectric layer and each content thereof, the temperature of the heat treatment and the partial pressure of oxygen during the heat treatment according to Comparative Example 3 are illustrated in Table 1. Furthermore, the A and B site distribution ratios of Sr and Mn calculated by the ALCHEMI analysis and the value of the B site distribution ratio of Sr/content of Sr are illustrated.

Comparative Example 4

The thin film of $(K_{0.5}Na_{0.5})NbO_3$ containing Sr of 1.0 at % and Mn of 1.0 at % was deposited as the piezoelectric layer. The sintered body of $(K_{0.5}Na_{0.5})NbO_3$ containing Sr of 1.0 at % and Mn of 1.0 at % was used as a sputtering target. A temperature of the base body was 550° C. and a thickness of the piezoelectric layer was 2000 nm during the deposition.

After the piezoelectric layer was deposited, the base body was transferred to the heat treatment apparatus and then a heat treatment was carried out. The heat treatment was carried out for one hour while setting a temperature of the heat treatment at 500° C. and supplying nitrogen-oxygen gas mixtures. In addition, a partial pressure of oxygen was set at 1.5%.

The piezoelectric element of Comparative Example 4 was manufactured using the same element configuration and manufacturing step as Example 1 except the piezoelectric layer.

Comparative Example 5

The thin film of $(K_{0.5}Na_{0.5})NbO_3$ containing Sr of 1.0 at % and Mn of 1.0 at % was deposited as the piezoelectric layer. The sintered body of $(K_{0.5}Na_{0.5})NbO_3$ containing Sr of 1.0 at % and Mn of 1.0 at % was used as a sputtering target. A temperature of the base body was 550° C. and a thickness of the piezoelectric layer was 2000 nm during the deposition.

After the piezoelectric layer was deposited, the base body was transferred to the heat treatment apparatus and then a heat treatment was carried out. The heat treatment was carried out for one hour while setting a temperature of the heat treatment at 600° C. and supplying nitrogen-oxygen gas mixtures. In addition, the partial pressure of the oxygen was set at 1.0%.

The piezoelectric element of Comparative Example 5 was manufactured using the same element configuration and manufacturing step as Example 1 except the piezoelectric layer.

Main ingredients, additives of the piezoelectric layer and each content thereof, the temperature of the heat treatment and the partial pressure of oxygen during the heat treatment according to Comparative Examples 4 and 5 are illustrated in Table 1. Furthermore, the A and B site distribution ratios of Sr and Mn calculated by the ALCHEMY analysis and the value of the B site distribution ratio of Sr/content of Sr are illustrated.

Examples 2 to 7

Except that heat treatment was carried out under the conditions illustrated in Table 1 after the piezoelectric layer 10 was deposited, the piezoelectric elements 100 of Examples 2 to 7 were manufactured as in Example 1.

Main ingredients, additives of the piezoelectric layer 10 and each content thereof, the temperature of the heat treatment and the partial pressure of the oxygen during the heat treatment according to Examples 2 to 7 are illustrated in Table 1. Furthermore, the A and B site distribution ratios of Sr and Mn calculated by the ALCHEMI analysis and the value of the B site distribution ratio of Sr/content of Sr are illustrated.

Figure 6:
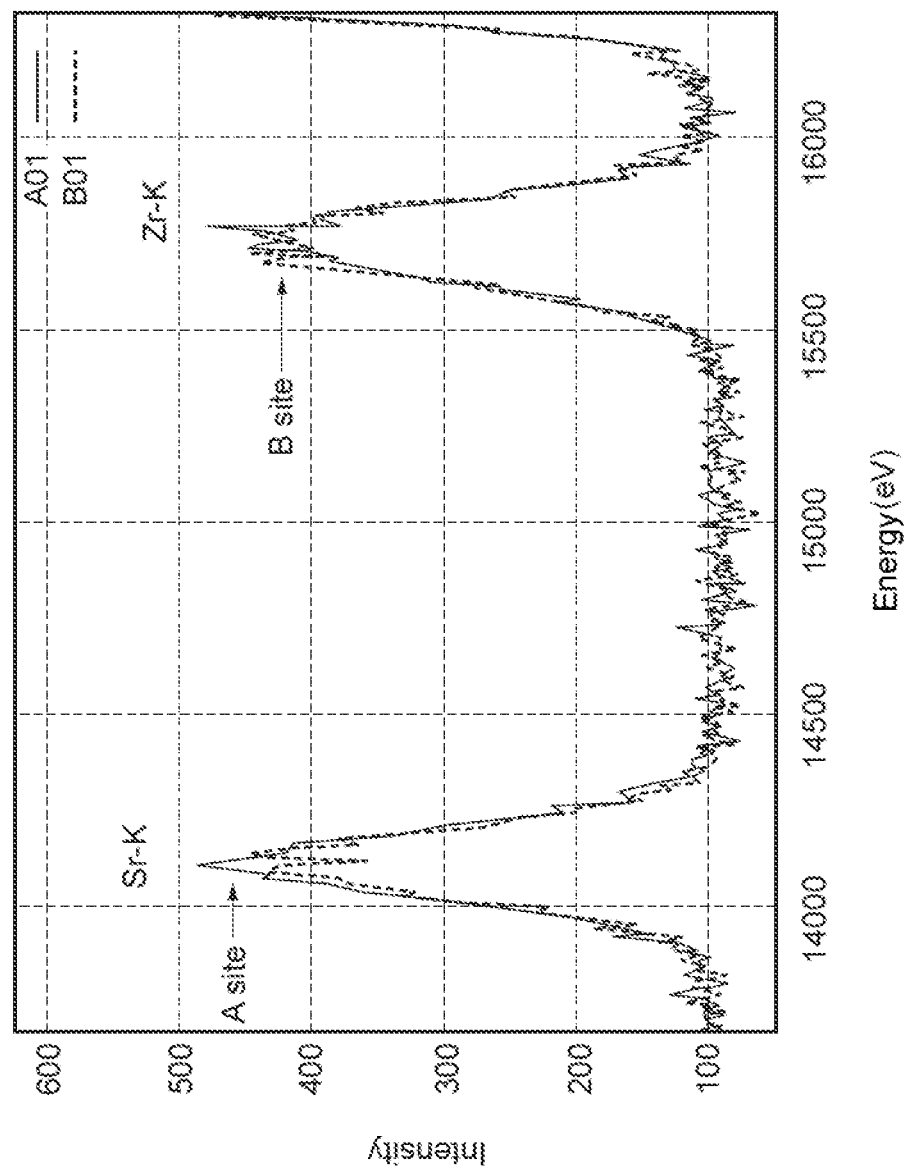
FIG. 6 is a measurement result of an energy dispersion X-ray spectrum relating to Sr which is used to calculate a site distribution ratio by using ALCHEMI method in an example according to an embodiment of the invention.
Figure 7:
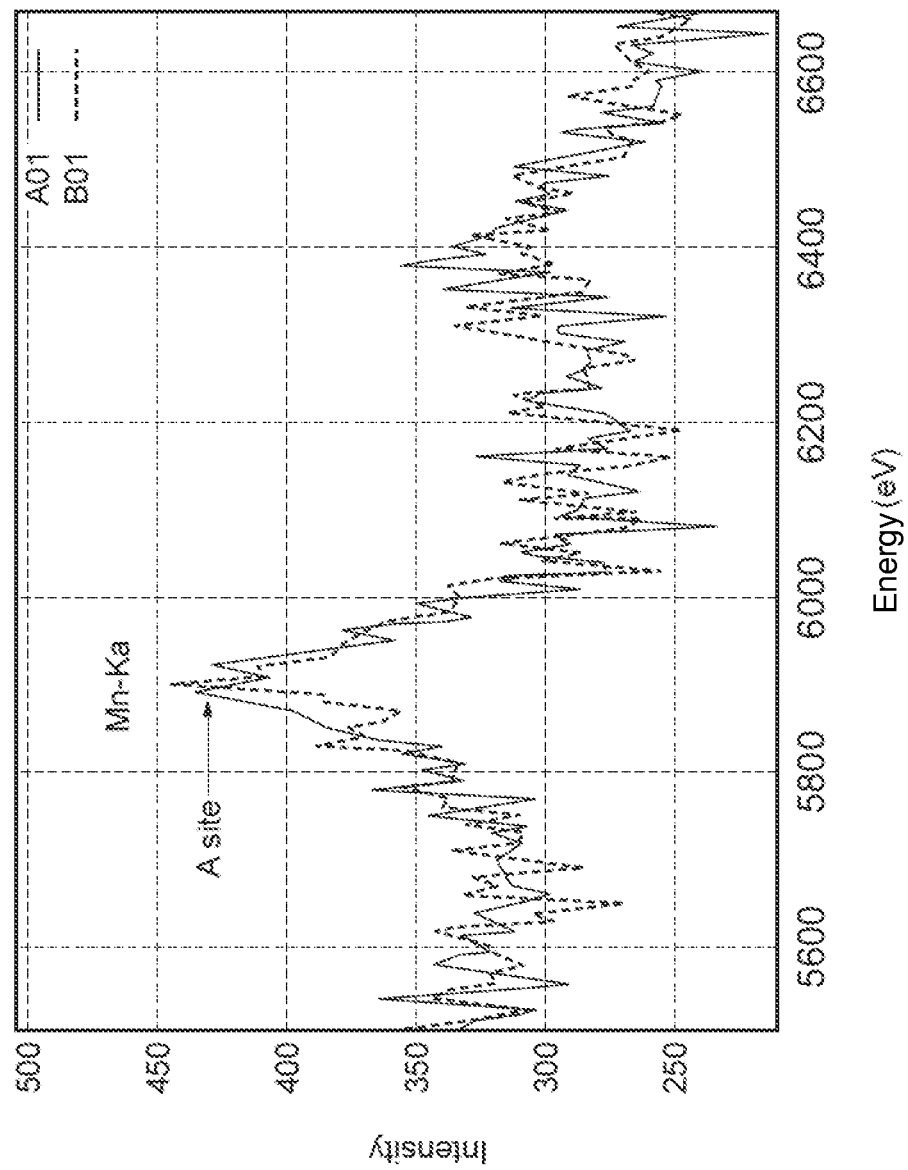
FIG. 7 is a measurement result of an energy dispersion X-ray spectrum relating to Mn which is used to calculate a site distribution ratio by using ALCHEMI method in an example according to an embodiment of the invention.

FIGS. 6 and 7 illustrate an EDS spectrum which was used in the ALCHEMI analysis of the piezoelectric layer 10 used in Example 4. FIG. 6 illustrates a signal relating to Sr and FIG. 7 illustrates a signal relating to Mn. Distribution ratio dependence of intensity ratio which was $T_{Asite}$ (a theoretical value of A site intensity)/$I_{Bsite}$ (a theoretical value of B site intensity) was calculated in theory and then was compared with an intensity ratio obtained from experiments illustrated in FIGS. 6 and 7. Accordingly, the site distribution ratios of Sr and Mn were calculated by using the ALCHEMI analysis from signals which derived the site distribution ratios of Sr and Mn.

Examples 8 to 17

The piezoelectric layer 10 was formed by using the materials illustrated in Table 1 as a sputtering target. In addition, after the piezoelectric layer 10 was deposited, a heat treatment was carried out under the conditions illustrated in Table 1. Under the same conditions as Example 1 in the other configuration and manufacturing steps, the piezoelectric elements 100 of Examples 8 to 17 were manufactured.

Main ingredients, additives of the piezoelectric layer 10 and each content thereof, the temperature of the heat treatment and the partial pressure of oxygen during the heat treatment in Examples 8 to 17 are illustrated in Table 1. Furthermore, the A and B site distribution ratios of Sr and Mn calculated by the ALCHEMI analysis and the value of the B site distribution ratio of Sr/content of Sr are illustrated.

(Evaluation of Piezoelectric Element)

A leak current density of each of the piezoelectric elements of Examples 1 to 17 and that of Comparative Examples 1 to 5 were evaluated by using a ferroelectrics evaluation system TF-1000 (manufactured by aixACCT GmbH). The measurements were carried out every two seconds in a step of 2V with an applied voltage at ±20V. An absolute value of maximum leak current density obtained in the measurements is illustrated in Table 2. Furthermore, displacement amount when applying the voltage to each piezoelectric element was measured by using Laser Doppler vibrometer (manufactured by Graphtec Corp.). The first electrode layer was connected to a positive electrode and the second electrode layer was connected to a negative electrode, and the measured values of the displacement amounts by applying a sine wave voltage (±3 V or ±20 V) with a frequency of 1 kHz are illustrated in Table 2.

It was confirmed that, in the piezoelectric elements of Examples 1 to 17 including, as a piezoelectric layer, a thin film of (Ka,Na)NbO$_3$ (potassium sodium niobate) that was a perovskite compound represented by a general expression ABO$_3$, in which Sr (strontium) and Mn (manganese) are contained as additives, and where Sr was substituted on both of the A site and the B site, and Mn was substituted only on the A site, the absolute values of maximum leak current densities thereof when applying ±20 V were smaller and the displacement amounts thereof were greater than the piezoelectric elements of Comparative Examples 1 to 5 which did not include the requirements.

It was confirmed that, in the piezoelectric elements of Examples 2 to 6 and Examples 8 to 17 including, as a piezoelectric layer, a thin film of potassium sodium niobate in which the B site distribution ratio of Sr was 5% or more and 50% or less, the absolute values of maximum leak current densities were smaller and the displacement amounts thereof when applying ±20 V were greater than the piezoelectric elements of Example 1 and Example 7 in which the B site distribution ratio of Sr was out of the range described above.

It was confirmed that, in the piezoelectric elements of Examples 8 to 17 including, as the piezoelectric layer, a thin film of potassium sodium niobate containing at least one or more components selected from Li (lithium), Ba (barium), Ta (tantalum), Zr (zirconium), the absolute values of maximum leak current densities thereof were smaller and the displacement amounts thereof when applying ±20 V were greater than the piezoelectric elements of Examples 1 to 7 which did not include the components described above.

It was confirmed that, in the piezoelectric elements of Examples 14 to 16 including, as the piezoelectric layer, a thin film of potassium sodium niobate in which a value calculated from the content of Sr and the B site distribution ratio of Sr which was represented by the following expression (1) was 5.0 or more and 50 or less, the absolute values of maximum leak current densities thereof was smaller and the displacement amounts thereof when applying ±20 V was greater than the piezoelectric elements of Examples 13 and 17 which have the same configuration as above Examples 14 to 16 except that the value was out of the range.

B site distribution ratio (%) of Sr/content (at %) of Sr  Expression (1)

In the examples described above, a ratio between K and Na which are the main ingredients of the A site was 1, in other words, x in K$_{1-x}$Na, was 0.5; however, the effect of the invention does not change even in a composition in which x has a value other than 0.5. In addition, in the examples described above, only the examples in which the additives Zr, Li, Ba and Ta are added in 1 at %, respectively is described. Meanwhile, if each content thereof is increased within preferred range of content described above, the displacement amounts tend to decrease slightly and the rates of change in the dielectric constants tend to increase; however, the preferred range is maintained.

In addition, when the piezoelectric layer comes into contact with other layers, even though a very small portion of Mn in the piezoelectric layer is substituted on the B site in a vicinity of a boundary of the piezoelectric layer, the effect of the invention does not change.

The piezoelectric element according to the invention includes the piezoelectric layer having a predetermined composition and uses the piezoelectric layer having a small leak current and a large displacement amount as the piezoelectric layer of the piezoelectric actuator. Accordingly, a high withstand voltage and a sufficient displacement amount can be obtained.

In addition, as for the piezoelectric layer of the piezoelectric sensor, the piezoelectric layer having a small leak current and a large displacement amount is used. Accordingly, a high withstand voltage and a sufficient detection sensitivity can be obtained.

In the piezoelectric element which is used in the head assembly of the hard disk drive, as for the piezoelectric layer, the piezoelectric layer having a small leak current and a large displacement amount is used. Accordingly, a high withstand voltage and a sufficient accessibility can be obtained.

Moreover, in the piezoelectric element which is used in the piezoelectric actuator of the ink jet printer head, as for the piezoelectric layer, the piezoelectric layer having a small leak current and a large displacement amount is used. Accordingly, the ink jet printer apparatus having a high withstand voltage and a high safety can be provided.

TABLE 1

| | | Added element | | Heat treatment | | ALCHEMI measurement result | | | | B site distribution ratio of Sr (%)/ Content of Sr (at %) |
|---|---|---|---|---|---|---|---|---|---|---|
| | | | | | | Sr | | Mn | | |
| | | | | | | A site | B site | A site | B site | |
| | Main component | Element | Content (at %) | Partial pressure of oxygen (%) | Temperature (°C.) | distribution ratio (%) | distribution ratio (%) | distribution ratio (%) | distribution ratio (%) | |
| Comparative example 1 | $(K_{1-x}Na_x)NbO_3$ $x = 0.50$ | 1<br>2<br>3<br>4<br>5<br>6 | —<br>—<br>—<br>—<br>—<br>— | —<br>—<br>—<br>—<br>—<br>— | — | — | — | — | — | — | — |
| Comparative example 2 | $(K_{1-x}Na_x)NbO_3$ $x = 0.50$ | 1 Sr<br>2 Mn<br>3<br>4<br>5<br>6 | 1.0<br>1.0<br>—<br>—<br>—<br>— | — | — | 100.0 | 0.0 | 0.0 | 100.0 | 0.0 |
| Comparative example 3 | $(K_{1-x}Na_x)NbO_3$ $x = 0.50$ | 1 Sr<br>2 Mn<br>3<br>4<br>5<br>6 | 1.0<br>1.0<br>—<br>—<br>—<br>— | 1.0 | 500 | 100.0 | 0.0 | 51.1 | 48.9 | 0.0 |
| Comparative example 4 | $(K_{1-x}Na_x)NbO_3$ $x = 0.50$ | 1 Sr<br>2 Mn<br>3<br>4<br>5<br>6 | 1.0<br>1.0<br>—<br>—<br>—<br>— | 1.5 | 500 | 97.0 | 3.0 | 51.1 | 48.9 | 3.0 |
| Comparative example 5 | $(K_{1-x}Na_x)NbO_3$ $x = 0.50$ | 1 Sr<br>2 Mn<br>3<br>4<br>5<br>6 | 1.0<br>1.0<br>—<br>—<br>—<br>— | 1.0 | 600 | 100.0 | 0.0 | 100.0 | 0.0 | 0.0 |
| Example 1 | $(K_{1-x}Na_x)NbO_3$ $x = 0.50$ | 1 Sr<br>2 Mn<br>3<br>4<br>5<br>6 | 1.0<br>1.0<br>—<br>—<br>—<br>— | 1.5 | 600 | 97.0 | 3.0 | 100.0 | 0.0 | 3.0 |
| Example 2 | $(K_{1-x}Na_x)NbO_3$ $x = 0.50$ | 1 Sr<br>2 Mn<br>3<br>4<br>5<br>6 | 1.0<br>1.0<br>—<br>—<br>—<br>— | 5.5 | 600 | 94.9 | 5.1 | 100.0 | 0.0 | 5.1 |
| Example 3 | $(K_{1-x}Na_x)NbO_3$ $x = 0.50$ | 1 Sr<br>2 Mn<br>3<br>4<br>5<br>6 | 1.0<br>1.0<br>—<br>—<br>—<br>— | 13.4 | 600 | 83.0 | 17.0 | 100.0 | 0.0 | 17.0 |
| Example 4 | $(K_{1-x}Na_x)NbO_3$ $x = 0.50$ | 1 Sr<br>2 Mn<br>3 | 1.0<br>1.0<br>— | 21.1 | 600 | 79.0 | 21.0 | 100.0 | 0.0 | 21.0 |

TABLE 1-continued

| | | Added element | | Heat treatment | | ALCHEMI measurement result | | | | B site distribution ratio of Sr (%)/ Content of Sr (at %) |
|---|---|---|---|---|---|---|---|---|---|---|
| | | | | | | Sr | | Mn | | |
| | Main component | Element | Content (at %) | Partial pressure of oxygen (%) | Temperature (° C.) | A site distribution ratio (%) | B site distribution ratio (%) | A site distribution ratio (%) | B site distribution ratio (%) | |
| | | 4 — — | | | | | | | | |
| | | 5 — — | | | | | | | | |
| | | 6 — — | | | | | | | | |
| Example 5 | $(K_{1-x}Na_x)NbO_3$ $x = 0.50$ | 1 Sr 1.0 | | 26.4 | 600 | 63.3 | 36.7 | 100.0 | 0.0 | 36.7 |
| | | 2 Mn 1.0 | | | | | | | | |
| | | 3 — — | | | | | | | | |
| | | 4 — — | | | | | | | | |
| | | 5 — — | | | | | | | | |
| | | 6 — — | | | | | | | | |
| Example 6 | $(K_{1-x}Na_x)NbO_3$ $x = 0.50$ | 1 Sr 1.0 | | 29.1 | 600 | 51.0 | 49.0 | 100.0 | 0.0 | 49.0 |
| | | 2 Mn 1.0 | | | | | | | | |
| | | 3 — — | | | | | | | | |
| | | 4 — — | | | | | | | | |
| | | 5 — — | | | | | | | | |
| | | 6 — — | | | | | | | | |
| Example 7 | $(K_{1-x}Na_x)NbO_3$ $x = 0.50$ | 1 Sr 1.0 | | 33 | 600 | 39.0 | 61.0 | 100.0 | 0.0 | 61.0 |
| | | 2 Mn 1.0 | | | | | | | | |
| | | 3 — — | | | | | | | | |
| | | 4 — — | | | | | | | | |
| | | 5 — — | | | | | | | | |
| | | 6 — — | | | | | | | | |
| Example 8 | $(K_{1-x}Na_x)NbO_3$ $x = 0.50$ | 1 Sr 1.0 | | 21 | 600 | 79.0 | 21.0 | 100.0 | 0.0 | 21.0 |
| | | 2 Mn 1.0 | | | | | | | | |
| | | 3 Li 1.0 | | | | | | | | |
| | | 4 — — | | | | | | | | |
| | | 5 — — | | | | | | | | |
| | | 6 — — | | | | | | | | |
| Example 9 | $(K_{1-x}Na_x)NbO_3$ $x = 0.50$ | 1 Sr 1.0 | | 21.3 | 600 | 79.0 | 21.0 | 100.0 | 0.0 | 21.0 |
| | | 2 Mn 1.0 | | | | | | | | |
| | | 3 Ba 1.0 | | | | | | | | |
| | | 4 — — | | | | | | | | |
| | | 5 — — | | | | | | | | |
| | | 6 — — | | | | | | | | |
| Example 10 | $(K_{1-x}Na_x)NbO_3$ $x = 0.50$ | 1 Sr 1.0 | | 20.8 | 600 | 79.0 | 21.0 | 100.0 | 0.0 | 21.0 |
| | | 2 Mn 1.0 | | | | | | | | |
| | | 3 Ta 1.0 | | | | | | | | |
| | | 4 — — | | | | | | | | |
| | | 5 — — | | | | | | | | |
| | | 6 — — | | | | | | | | |
| Example 11 | $(K_{1-x}Na_x)NbO_3$ $x = 0.50$ | 1 Sr 1.0 | | 21.2 | 600 | 79.0 | 21.0 | 100.0 | 0.0 | 21.0 |
| | | 2 Mn 1.0 | | | | | | | | |
| | | 3 Zr 1.0 | | | | | | | | |
| | | 4 — — | | | | | | | | |
| | | 5 — — | | | | | | | | |
| | | 6 — — | | | | | | | | |
| Example 12 | $(K_{1-x}Na_x)NbO_3$ $x = 0.50$ | 1 Sr 1.0 | | 21.4 | 600 | 79.0 | 21.0 | 100.0 | 0.0 | 21.0 |
| | | 2 Mn 1.0 | | | | | | | | |
| | | 3 Li 1.0 | | | | | | | | |
| | | 4 Ba 1.0 | | | | | | | | |
| | | 5 Ta 1.0 | | | | | | | | |
| | | 6 Zr 1.0 | | | | | | | | |
| Example 13 | $(K_{1-x}Na_x)NbO_3$ $x = 0.50$ | 1 Sr 0.1 | | 5.4 | 600 | 95.0 | 5.0 | 100.0 | 0.0 | 50.0 |
| | | 2 Mn 1.0 | | | | | | | | |
| | | 3 Li 1.0 | | | | | | | | |
| | | 4 Ba 1.0 | | | | | | | | |
| | | 5 Ta 1.0 | | | | | | | | |
| | | 6 Zr 1.0 | | | | | | | | |
| Example 14 | $(K_{1-x}Na_x)NbO_3$ $x = 0.50$ | 1 Sr 1.0 | | 14 | 600 | 82.0 | 18.0 | 100.0 | 0.0 | 18.0 |
| | | 2 Mn 1.0 | | | | | | | | |
| | | 3 Li 1.0 | | | | | | | | |
| | | 4 Ba 1.0 | | | | | | | | |
| | | 5 Ta 1.0 | | | | | | | | |
| | | 6 Zr 1.0 | | | | | | | | |
| Example 15 | $(K_{1-x}Na_x)NbO_3$ $x = 0.50$ | 1 Sr 3.0 | | 22.1 | 600 | 78.0 | 22.0 | 100.0 | 0.0 | 7.3 |
| | | 2 Mn 1.0 | | | | | | | | |
| | | 3 Li 1.0 | | | | | | | | |
| | | 4 Ba 1.0 | | | | | | | | |
| | | 5 Ta 1.0 | | | | | | | | |
| | | 6 Zr 1.0 | | | | | | | | |

TABLE 1-continued

| | | Added element | | Heat treatment | | ALCHEMI measurement result | | | | B site distribution ratio of Sr (%)/ Content of Sr (at %) |
|---|---|---|---|---|---|---|---|---|---|---|
| | | | | | | Sr | | Mn | | |
| | Main component | Element | Content (at %) | Partial pressure of oxygen (%) | Temperature (° C.) | A site distribution ratio (%) | B site distribution ratio (%) | A site distribution ratio (%) | B site distribution ratio (%) | |
| Example 16 | $(K_{1-x}Na_x)NbO_3$ $x = 0.50$ | 1 Sr | 4.8 | 23.5 | 600 | 74.8 | 25.2 | 100.0 | 0.0 | 5.3 |
| | | 2 Mn | 1.0 | | | | | | | |
| | | 3 Li | 1.0 | | | | | | | |
| | | 4 Ba | 1.0 | | | | | | | |
| | | 5 Ta | 1.0 | | | | | | | |
| | | 6 Zr | 1.0 | | | | | | | |
| Example 17 | $(K_{1-x}Na_x)NbO_3$ $x = 0.50$ | 1 Sr | 4.8 | 19.2 | 600 | 80.0 | 20.0 | 100.0 | 0.0 | 4.2 |
| | | 2 Mn | 1.0 | | | | | | | |
| | | 3 Li | 1.0 | | | | | | | |
| | | 4 Ba | 1.0 | | | | | | | |
| | | 5 Ta | 1.0 | | | | | | | |
| | | 6 Zr | 1.0 | | | | | | | |

TABLE 2

| | Displacement amount (μm) | | Leak current (A/cm2) |
|---|---|---|---|
| | 3 V | 20 V | ±20 V |
| Comparative example 1 | 0.06 | 0.100 | 2.20E−02 |
| Comparative example 2 | 0.117 | 0.158 | 1.50E−04 |
| Comparative example 3 | 0.121 | 0.201 | 1.52E−05 |
| Comparative example 4 | 0.2 | 0.333 | 1.60E−05 |
| Comparative example 5 | 0.131 | 0.850 | 3.10E−07 |
| Example 1 | 0.25 | 1.63 | 2.80E−07 |
| Example 2 | 0.621 | 4.14 | 2.60E−07 |
| Example 3 | 0.593 | 4.11 | 2.67E−07 |
| Example 4 | 0.501 | 3.674 | 2.22E−07 |
| Example 5 | 0.411 | 2.66 | 2.54E−07 |
| Example 6 | 0.382 | 2.44 | 1.99E−07 |
| Example 7 | 0.145 | 0.92 | 3.20E−07 |
| Example 8 | 0.881 | 6.04 | 2.50E−07 |
| Example 9 | 0.903 | 6.22 | 2.20E−07 |
| Example 10 | 0.909 | 6.11 | 2.13E−07 |
| Example 11 | 0.921 | 6.33 | 2.00E−07 |
| Example 12 | 1.321 | 8.9 | 1.80E−07 |
| Example 13 | 1.08 | 6.99 | 1.90E−07 |
| Example 14 | 1.68 | 12.32 | 1.50E−07 |
| Example 15 | 1.55 | 11.01 | 1.63E−07 |
| Example 16 | 1.45 | 10.43 | 1.55E−07 |
| Example 17 | 1.1 | 7.01 | 1.87E−07 |

The invention claimed is:

1. A piezoelectric element which includes, as a piezoelectric layer, a thin film of potassium sodium niobate that is a perovskite compound represented by a general expression $ABO_3$,
wherein the piezoelectric layer contains Sr (strontium) and Mn (manganese) as additives,
wherein Sr is substituted on both of an A site and a B site and
wherein Mn is substituted only on the A site.

2. The piezoelectric element according to claim 1,
wherein a B site distribution ratio of Sr is 5% or more and 50% or less in the piezoelectric layer.

3. The piezoelectric element according to claim 1,
wherein the piezoelectric layer contains at least one or more components selected from Li (lithium), Ba (barium), Ta (tantalum) and Zr (zirconium).

4. A piezoelectric actuator using the piezoelectric element according to claim 1.

5. A piezoelectric sensor using the piezoelectric element according to claim 1.

6. A hard disk drive comprising the piezoelectric actuator according to claim 4.

7. An ink jet printer apparatus comprising the piezoelectric actuator according to claim 4.

* * * * *